(12) United States Patent
Itakura et al.

(10) Patent No.: US 10,094,871 B2
(45) Date of Patent: Oct. 9, 2018

(54) ELECTRONIC-COMPONENT TESTING DEVICE

(71) Applicant: MURATA MANUFACTURING CO., LTD., Kyoto-fu (JP)

(72) Inventors: Masakazu Itakura, Nagaokakyo (JP); Tetsuo Kawasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 56 days.

(21) Appl. No.: 15/486,425

(22) Filed: Apr. 13, 2017

(65) Prior Publication Data

US 2017/0219646 A1 Aug. 3, 2017

Related U.S. Application Data

(63) Continuation of application No. PCT/JP2015/077128, filed on Sep. 25, 2015.

(30) Foreign Application Priority Data

Oct. 23, 2014 (JP) ................. 2014-216369

(51) Int. Cl.
*G01R 31/28* (2006.01)
*G01R 31/02* (2006.01)
*G01R 31/26* (2014.01)

(52) U.S. Cl.
CPC ....... *G01R 31/2849* (2013.01); *G01R 31/028* (2013.01); *G01R 31/2642* (2013.01)

(58) Field of Classification Search
CPC .............. G01R 31/2849; G01R 31/028; G01R 31/2642
See application file for complete search history.

(56) References Cited

U.S. PATENT DOCUMENTS

| | | | | |
|---|---|---|---|---|
| 6,956,391 B2* | 10/2005 | Kamitani | ............. | G01R 31/016 324/750.05 |
| 7,397,258 B2* | 7/2008 | Suga | .................. | G01R 31/2875 324/750.07 |
| 2006/0245161 A1* | 11/2006 | Maruyama | ......... | G01R 31/2874 361/695 |
| 2008/0309361 A1* | 12/2008 | Kita | ................... | G01R 31/2855 324/750.05 |

(Continued)

FOREIGN PATENT DOCUMENTS

| JP | H09-5356 A | 1/1997 |
|---|---|---|
| JP | 2001-141766 A | 5/2001 |
| JP | 2001-235511 A | 8/2001 |

(Continued)

OTHER PUBLICATIONS

International Search Report issued in PCT/JP2015/077128; dated Nov. 24, 2015.

(Continued)

*Primary Examiner* — Daniel Miller
(74) *Attorney, Agent, or Firm* — Studebaker & Brackett PC (57) ABSTRACT

An electronic-component testing device capable of achieving efficient heat-releasing from a self-heating electronic component and efficiently performing a desired test while maintaining the temperature of the electronic component in a predetermined range higher than ordinary temperature.

6 Claims, 7 Drawing Sheets

(56) References Cited

U.S. PATENT DOCUMENTS

2013/0015869 A1* 1/2013 Francisco .......... G01R 31/2891
324/750.03
2014/0203829 A1* 7/2014 Yamada ............. G01R 31/2863
324/750.08

FOREIGN PATENT DOCUMENTS

| JP | 2002-064041 A | 2/2002 |
| JP | 2004-055870 A | 2/2004 |
| JP | 2008-192994 A | 8/2008 |
| JP | 2008-275512 A | 11/2008 |
| JP | 2009-250810 A | 10/2009 |
| JP | 2012-141267 A | 7/2012 |

OTHER PUBLICATIONS

Written Opinion issued in PCT/JP2015/077128; dated Nov. 24, 2015.

* cited by examiner

ELECTRONIC-COMPONENT TESTING DEVICE

CROSS REFERENCE TO RELATED APPLICATIONS

This application claims benefit of priority to Japanese Patent Application 2014-216369 filed Oct. 23, 2014, and to International Patent Application No. PCT/JP2015/077128 filed Sep. 25, 2015, the entire content of which is incorporated herein by reference.

TECHNICAL FIELD

The present disclosure relates to an electronic-component testing device, and more particularly, an electronic-component testing device used to perform a test by applying voltage to a self-heating electronic component under a predetermined temperature condition.

BACKGROUND

In a test performed by applying predetermined stress such as voltage to a self-heating electronic component at a predetermined test temperature, the temperature of the electronic component becomes higher than the test temperature due to self-heating of the electronic component. For this reason, a cooling mechanism has been conventionally used to maintain the temperature of the electronic component in a certain range.

For example, Japanese Patent Application Laid-Open No. 2009-250810 discloses a temperature control device as a temperature control device for the above purpose. The disclosed temperature control device includes: a cooling device including a flow path through which coolant flows and a heat-absorbing unit and a heat-releasing unit provided halfway of the flow path, and configured to exchange heat of the electronic component absorbed by the heat-absorbing unit with the coolant in the heat-releasing unit to cool the electronic component by allowing an electronic component to directly or indirectly contact the heat-absorbing unit; a heating device configured to heat the electronic component; and a control unit configured to control the temperature of the electronic component by controlling operation of the heating device. The heat-releasing unit of the cooling device includes a heat-releasing member made of a foam metal material.

The above-configured temperature control device according to Japanese Patent Application Laid-Open No. 2009-250810 has an excellent response in feedback control of the temperature of an electronic component with a large self-heating amount, and allows a characteristic examination to be performed on the electronic component while accurately maintaining the temperature of the electronic component at a predetermined temperature.

However in the case of Japanese Patent Application Laid-Open No. 2009-250810, a member (heat-transfer block 9 (refer to FIG. 1 in Japanese Patent Application Laid-Open No. 2009-250810)) including a temperature sensor (a first temperature sensor 11 (refer to FIG. 1 in Japanese Patent Application Laid-Open No. 2009-250810)) has a large heat capacity, which causes underestimation of the temperature of the electronic component due to diffusion of heat transferred from the electronic component, and thus the temperature of a self-heating electronic component cannot be accurately detected.

In particular, in a test performed by applying voltage to an electronic component having a negative resistance temperature characteristic, a phenomenon called thermal runaway may occur. In the thermal runaway, self-heating due to energization increases the temperature of the electronic component, the temperature increase reduces resistance and increases current accordingly, and then the current increase increases self-heating. Thus, in such an electronic component, feedback control cannot be performed fast enough to handle self-heating, causing the thermal runaway.

Japanese Patent Application Laid-Open No. 2008-275512 discloses an aging device configured to cool a self-heating sample body to perform temperature adjustment by bringing the sample body into contact with a cooling plate, heat of which is exchanged through a coolant supplied from a coolant supply unit. The aging device includes a temperature detection unit configured to detect the temperature of the sample body, and a coolant flow rate adjuster configured to adjust the flow rate of the coolant supplied by the coolant supply unit based on a result of the temperature detection of the sample body by the temperature detection unit.

It is disclosed that the aging device can reduce change in the temperature of a self-heating sample body by following the change.

However, in the aging device, too, a temperature sensor is directly attached to the sample body. When a large number of electronic components need to be frequently replaced to measure temperature, work needs to be done to attach a temperature sensor at each exchange of electronic components as measurement targets, which is inefficient. When a temperature sensor is attached to a water-cooling plate, the temperature of the sample body is not directly measured, and thus the temperature of a self-heating electronic component cannot be accurately detected due to underestimation of the temperature of the electronic component, which is a problem the same as that of Japanese Patent Application Laid-Open No. 2009-250810.

SUMMARY

Problem to be Solved by the Disclosure

The present disclosure is intended to solve the above-described problem and provide an electronic-component testing device used to perform a test by applying voltage to a self-heating electronic component under a predetermined temperature condition, and capable of efficiently releasing heat from the self-heating electronic component and efficiently performing a desired test while maintaining, in a predetermined range, the temperature of an electronic component likely to suffer thermal runaway due to self-heating.

Means for Solving the Problem

To solve the above-described problem, an electronic-component testing device according to the present disclosure is configured to perform a test by applying voltage while keeping, at a predetermined test temperature higher than ordinary temperature, a self-heating electronic component including a first external electrode and a second external electrode. The electronic-component testing device includes:

a first conduction terminal having a principal surface on which the electronic component is held, the first conduction terminal includes an insulation region at least a surface of which is an insulating material and a region other than the insulation region, the first external electrode of the electronic component contacting the insulation region to prevent electrical conduction and the second external electrode contacting the region other than the insulation region to allow electrical conduction, the first conduction terminal includes a heater configured to heat the electronic component to the test temperature, and is capable of releasing a larger amount of heat than the amount of heat generated by self-heating of the electronic component;

a second conduction terminal configured to be pressed against the first external electrode of the electronic component held on the first conduction terminal, which contacts the insulation region of the first conduction terminal, in order to apply a predetermined pressing force toward the first conduction terminal;

an insulating terminal configured to be pressed against the second external electrode of the electronic component held on the first conduction terminal, which contacts the region other than the insulation region of the first conduction terminal to achieve electrical conduction, in order to apply a predetermined pressing force toward the first conduction terminal, or the insulating terminal configured to be pressed against a region of the electronic component, in which the first external electrode and the second external electrode are not located, in order to apply a predetermined pressing force toward the first conduction terminal;

a temperature sensor provided to one of the second conduction terminal and the insulating terminal to measure the temperature of the electronic component; and a control unit configured to control the heater to maintain the temperature of the electronic component at the test temperature by feeding back the temperature of the electronic component detected by the temperature sensor to the heater.

In the electronic-component testing device according to the present disclosure, an auxiliary heater is preferably arranged near the second conduction terminal and the insulating terminal to prevent heat from escaping from the electronic component through the second conduction terminal and the insulating terminal.

The auxiliary heaters arranged near the second conduction terminal and the insulating terminal can prevent heat from the electronic component from escaping through the second conduction terminal and the insulating terminal, and the electronic component can be more reliably maintained at a predetermined test temperature through the heat-releasing capacity and heating capacity of the first conduction terminal.

It is also preferable that the second conduction terminal individually contacts each of the first external electrodes of the plurality of the electronic components arranged side by side, the insulating terminal individually contacts each of the second external electrodes of the plurality of the electronic components, or each of the regions of the electronic components in which the first external electrode and the second external electrode are not located, the temperature sensor is provided to at least one of the second conduction terminal and the insulating terminal contacting each of the plurality of the electronic components, and the single first conduction terminal contacts each of the second external electrodes of the plurality of the electronic components.

The use of the single first conduction terminal for the plurality of the electronic components allows effective reduction in the thermal resistance of the first conduction terminal and reduction in device size as compared to a case with a plurality of the first conduction terminals.

It is also preferable that:

the plurality of the electronic components are heated to the predetermined test temperature while the second conduction terminal contacts the first external electrode of each of the plurality of the electronic components and the single first conduction terminal contacts each second external electrode;

the temperatures of the plurality of the electronic components or temperatures of predetermined electronic-component groups into which the plurality of the electronic components are divided are detected by a plurality of the temperature sensors; and an average value or an extracted representative value is calculated from the temperatures detected by the plurality of the temperature sensors, the average value or the extracted representative value is fed back to the heater to control the heater so that the temperature of the electronic component or each electronic-component group is maintained at the test temperature, and when any of the temperature sensors has detected an abnormal temperature, the electronic component or the electronic-component group for which the abnormal temperature is detected is excluded as an electronic component or an electronic-component group employed for the calculation.

With the above-described configuration, when an abnormal temperature due to, for example, self-heating is detected for any electronic component or electronic-component group, handling the temperature as an abnormal value allows substantial elimination of influence to the remaining majority of electronic components, thereby achieving correct temperature control.

It is also preferable that the electronic-component testing device includes a cooling unit configured to cool the first conduction terminal by airflow.

With the above-described configuration, the thermal resistance of the first conduction terminal can be reduced to improve feedback response to self-heating of the electronic component, thereby reducing occurrence of thermal runaway.

Another electronic-component testing device according to the present disclosure is configured to perform a test by applying voltage while keeping, at a predetermined test temperature higher than ordinary temperature, a self-heating electronic component including a first external electrode and a second external electrode. The electronic-component testing device includes:

a heat-transfer insulating terminal having a principal surface on which the electronic component is held, the heat-transfer insulating terminal includes regions that contact the first external electrode and the second external electrode of the electronic component, at least surfaces of the regions being an insulating material, the heat-transfer insulating terminal includes a heater configured to heat the electronic component to the test temperature, and is capable of releasing a larger amount of heat than the amount of heat generated by self-heating of the electronic component;

a first-side conduction terminal configured to be pressed against the first external electrode of the electronic component held on the heat-transfer insulating terminal to apply a predetermined pressing force toward the heat-transfer insulating terminal;

a second-side conduction terminal configured to be pressed against the second external electrode of the electronic component held on the heat-transfer insulating terminal to apply a predetermined pressing force toward the heat-transfer insulating terminal;

a temperature sensor provided to one of the first-side conduction terminal and the second-side conduction terminal to measure the temperature of the electronic component; and a control unit configured to control the heater to maintain the temperature of the electronic component at the test temperature by feeding back the temperature of the electronic component detected by the temperature sensor to the heater.

Advantageous Effect of the Disclosure

An electronic-component testing device according to the present disclosure includes: (a) a first conduction terminal including an insulation region with which a first external electrode of an electronic component contacts to prevent electrical conduction and a region other than the insulation region with which a second external electrode contacts to allow electrical conduction, including a heater configured to heat the electronic component to a test temperature, and capable of releasing a larger amount of heat than the amount of heat generated by self-heating of the electronic component; (b) a second conduction terminal configured to contact the first external electrode of the electronic component and be pressed against the electronic component to apply a predetermined pressing force toward the first conduction terminal; (c) an insulating terminal configured to contact the second external electrode of the electronic component, or a region of the electronic component, in which the first external electrode and the second external electrode are not disposed, and be pressed against the electronic component to apply a predetermined pressing force toward the first conduction terminal; and a control unit configured to control the heater to maintain the temperature of the electronic component at a predetermined test temperature by feeding back, to the heater, the temperature of the electronic component detected by a temperature sensor provided to any one of the second conduction terminal and the insulating terminal, using the first conduction terminal, the second conduction terminal, and the insulating terminal. With this configuration, the electronic-component testing device can achieve a faster temperature feedback response and substantial matching between a temperature detected by the temperature sensor and the temperature of the electronic component, thereby accurately controlling the temperature of the electronic component.

When the first conduction terminal is capable of releasing a larger amount of heat than the amount of heat generated by self-heating of the electronic component, the amount of released heat can be balanced with the amount of generated heat.

When the first conduction terminal is capable of releasing a smaller amount of heat than the amount of heat generated by self-heating of the electronic component, the amount of released heat cannot be balanced with the amount of generated heat, and the temperature of the electronic component keeps increasing.

Thus, in a test performed by heating a self-heating electronic component to a predetermined test temperature, the testing device according to the present disclosure can prevent thermal runaway of the electronic component and maintain the temperature of the electronic component at the predetermined test temperature, thereby accurately performing the test.

Another electronic-component testing device according to the present disclosure includes: (a) a heat-transfer insulating terminal including regions that contact a first external electrode and a second external electrode of an electronic component, at least surfaces of the regions being made of an insulating material, including a heater configured to heat the electronic component to a test temperature, and capable of releasing a larger amount of heat than the amount of heat generated by self-heating of the electronic component; (b) a first-side conduction terminal configured to contact the first external electrode of the electronic component and press the electronic component to apply a predetermined pressing force toward the heat-transfer insulating terminal; (c) a second-side conduction terminal configured to contact the second external electrode of the electronic component and press the electronic component to apply a predetermined pressing force toward the heat-transfer insulating terminal; and a control unit configured to control the heater to maintain the temperature of the electronic component at a predetermined test temperature by feeding back, to the heater, the temperature of the electronic component detected by a temperature sensor provided to any one of the first-side conduction terminal and the second-side conduction terminal, using the heat-transfer insulating terminal, the first-side conduction terminal, and the second-side conduction terminal. The electronic-component testing device can achieve a faster temperature feedback response and substantial matching between a temperature detected by the temperature sensor and the temperature of the electronic component, thereby accurately controlling the temperature of the electronic component.

When the heat-transfer insulating terminal is capable of releasing a larger amount of heat than the amount of heat generated by self-heating of the electronic component, the amount of released heat can be balanced with the amount of generated heat.

When the heat-transfer insulating terminal is capable of releasing a smaller amount of heat than the amount of heat generated by self-heating of the electronic component, the amount of released heat cannot be balanced with the amount of generated heat, and the temperature of the electronic component keeps increasing.

Thus, in a test performed by heating a self-heating electronic component to a predetermined test temperature, the other testing device according to the present disclosure can prevent thermal runaway of the electronic component due to self-heating and maintain the temperature of the electronic component at the predetermined test temperature, thereby accurately performing the test.

DETAILED DESCRIPTION

Features of the present disclosure will be described below in detail with reference to embodiments of the present disclosure.

Embodiment 1

Figure 1:
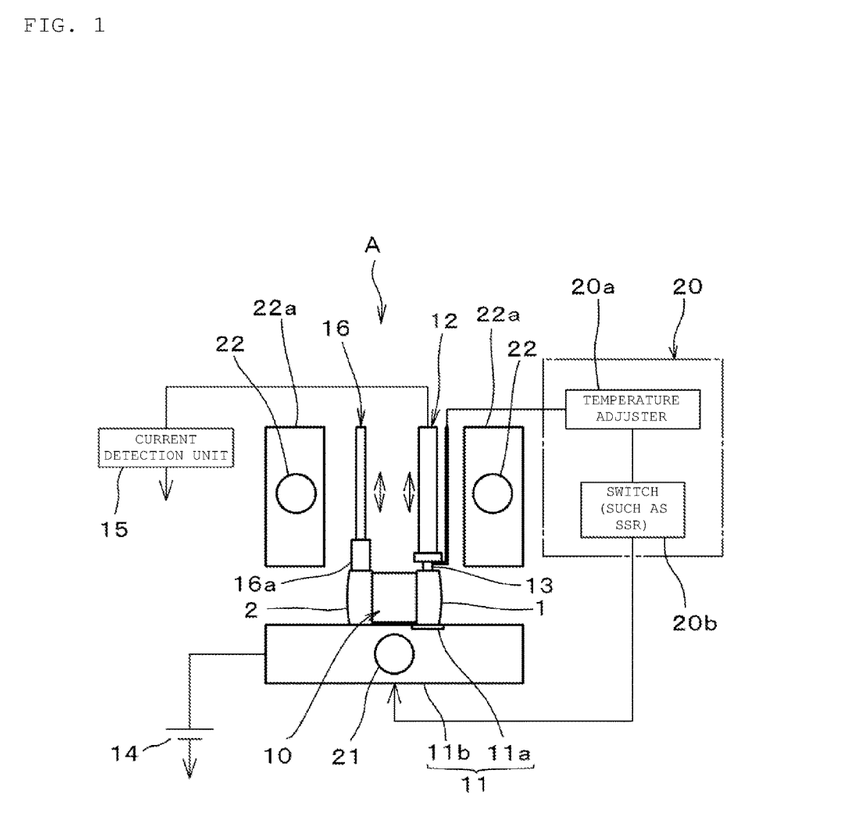
FIG. 1 is a diagram illustrating the configuration of an electronic-component testing device according to an embodiment of the present disclosure (Embodiment 1).

In Embodiment 1, exemplary description will be made of an electronic-component testing device A used in a screening process such as burn-in or a measuring process at high temperature. The electronic-component testing device A is configured to heat a self-heating electronic component (multilayer ceramic capacitor in Embodiment 1) 10 to a predetermined temperature (measurement temperature) higher than ordinary temperature and apply voltage after a predetermined time has elapsed. The self-heating electronic component (multilayer ceramic capacitor in Embodiment 1) 10 includes a pair of external electrodes of a first external electrode 1 and a second external electrode 2 as illustrated in FIG. 1.

As described above, the electronic-component testing device A is a device configured to perform a test by applying voltage while keeping the self-heating electronic component (multilayer ceramic capacitor) 10 at the predetermined test temperature higher than ordinary temperature.

The testing device A includes a metallic bar-shaped second conduction terminal 12, and a temperature sensor (thermocouple in Embodiment 1) 13 near a region of the second conduction terminal 12, which contacts the first external electrode 1 of the electronic component 10. The second conduction terminal 12 is configured to contact the first external electrode 1 of the electronic component (multilayer ceramic capacitor) 10. The temperature sensor 13 is used to measure the temperature of the electronic component 10. The second conduction terminal 12 is connected with a current detection unit 15.

In addition, an auxiliary heater 22 is disposed near the second conduction terminal 12 to prevent heat from escaping from the electronic component 10 through the second conduction terminal 12. Another auxiliary heater 22 is disposed near an insulating terminal 16 to prevent heat from escaping from the electronic component 10 through the insulating terminal 16.

The testing device A includes a first conduction terminal 11 on a principal surface of which the electronic component 10 is held. The first conduction terminal 11 includes an insulation region 11a a surface of which is made of insulating material, and a first conduction terminal body 11b as a region other than the insulation region 11a. The insulation region 11a contacts the first external electrode 1 of the electronic component 10, and the first conduction terminal body 11b contacts the second external electrode 2 of the electronic component 10. The first conduction terminal body 11b is connected with a voltage source 14.

The first conduction terminal 11 includes a heater (electronic component heater) 21 configured to heat the electronic component 10 to the test temperature, and is capable of releasing a larger amount of heat than the amount of heat generated by self-heating of the electronic component 10.

The testing device A includes the insulating terminal configured to press the second external electrode 2 of the electronic component 10 to apply a predetermined pressing force toward the first conduction terminal 11.

The testing device A includes a control unit 20 configured to control the heater 21 to maintain the temperature of the electronic component 10 at the predetermined temperature by feeding back, to the heater, the temperature of the electronic component 10 detected by the temperature sensor 13. In Embodiment 1, the control unit 20 includes a temperature adjuster 20a and a switch (such as SSR) 20b.

A test of the electronic component (multilayer ceramic capacitor) 10 by using the testing device A is performed in, for example, a procedure described below.

(1) The electronic component 10 is placed at a predetermined position on the first conduction terminal 11 with a lower end of the first external electrode 1 being in contact with the insulation region 11a, and a lower end of the second external electrode 2 being in contact with the first conduction terminal body 11b. Then, the second conduction terminal 12 is made contact with an upper end of the first external electrode 1, and the insulating terminal 16 is made in contact with an upper end of the second external electrode 2.

(2) The heater (electronic component heater) 21 is energized to heat the electronic component 10 to the test temperature (target temperature) (for example, 100° C.). In Embodiment 1, the temperatures of the heater (electronic component heater) 21 and the auxiliary heaters 22 are measured.

The test temperature is typically between 100° C. and 400° C. inclusive.

However, for example, when an external electrode of an electronic component such as a multilayer ceramic capacitor includes a Sn layer, the upper limit of the test temperature is restricted to 232° C. below the melting point of Sn. Alternatively, the upper limit of the test temperature is restricted to 260° C., for example, when typical fluorine resin electrical lines are used as wires connecting the first and second conduction terminals with the voltage source (power source) 14 and grounded wires.

(3) Then, a predetermined voltage is applied to the electronic component 10. For example, the electric field intensity is 20 kV/mm or larger, and the voltage is 3 V to 1000 V approximately.

(4) While the voltage is applied, the temperature of the electronic component 10 is detected by the temperature sensor 13 and fed back to the heater (electronic component heater) 21 of the first conduction terminal 11 to perform control.

With the configuration illustrated in FIG. 1, the temperature of the electronic component 10 is maintained at the predetermined test temperature by controlling opening and closing of the switch 20b connected with the heater 21 of the first conduction terminal 11.

(5) After a predetermined time has elapsed, the voltage application is ended, and the electronic component (multilayer ceramic capacitor) 10, on which the test is ended, is ejected.

Type of Electronic Component as Test Target

Examples of electronic components that can be tested by using the electronic-component testing device A according to Embodiment 1 include, in addition to the multilayer ceramic capacitor as described above, semiconductor elements such as a negative temperature coefficient thermistor, a diode, and a transistor, and capacitors other than a ceramic capacitor.

An electronic component to be tested by using the testing device according to the present disclosure basically includes the first external electrode and the second external electrode, but may include any other additional external electrode.

First Conduction Terminal

As described above, the first conduction terminal 11 includes the insulation region 11a and the first conduction terminal body 11b. The first conduction terminal body 11b is configured to contact the second external electrode 2 of the electronic component 10 to achieve electrical conduction, when the electronic component (multilayer ceramic capacitor in Embodiment 1) 10 is disposed at the predetermined position.

The first conduction terminal body 11b is preferably made of a material having a high thermal conductivity of 100 W/m·K or higher, such as, Al, Cu, or graphite. In Embodiment 1, the first conduction terminal body 11b is formed of, but not limited to, a metal plate, and may have a plate spring shape or any other typical shape of a measurement terminal.

To prevent the first external electrode 1 from contacting the first conduction terminal body 11b, the insulation region 11a is provided at a position where the insulation region 11a contacts the first external electrode 1 when the electronic component 10 is disposed at the predetermined position. The insulation region 11a is formed by joining an insulation material to the first conduction terminal body 11b. Alternatively, the insulation region 11a may be formed by coating the insulation material.

The insulation region 11a is preferably made of, for example, an insulating material having a high thermal conductivity of 100 W/m·K or higher, such as aluminum nitride.

The insulation region 11a preferably has a thickness of 10 mm or smaller.

To achieve favorable electric contact, typically, the first conduction terminal 11 desirably has the structure of a spring probe or a plate spring, which provides a spring characteristic of pressing toward the external electrode (second external electrode 2) of the electronic component 10.

When the second conduction terminal 12 has such a spring characteristic of providing pressing toward the external electrode of the electronic component, the first conduction terminal 11 does not need to have such a spring characteristic of providing pressing toward the external electrode of the electronic component.

In Embodiment 1, the first conduction terminal 11 is configured to function not only as a conduction terminal but also as a heating-cooling terminal.

To achieve this, the first conduction terminal 11 is desirably made of a high thermal conductivity material and desirably has a larger surface area (reduced thermal resistance).

The material and the surface area are typically determined based on a thermal resistance to be set.

For example, plating of Au, Ag, Ni, or Sn may be provided on a surface of the first conduction terminal 11, which contacts the second external electrode 2 of the electronic component 10, to achieve favorable electric and thermal connection between the first conduction terminal 11 and the second external electrode 2 of the electronic component 10.

The first conduction terminal 11 may have a different shape to achieve a reduced thermal resistance. For example, the first conduction terminal 11 may have a C shape similar to that of a heat radiating fin to achieve a larger surface area, thereby reducing the thermal resistance.

Heater (Electronic Component Heater)

The first conduction terminal 11 of the electronic-component testing device A according to Embodiment 1 includes the heater (electronic component heater) 21 for heating the electronic component 10.

Accordingly, the first conduction terminal 11 functions as a terminal for applying voltage, and also as a terminal for heating and cooling the electronic component 10.

In Embodiment 1, the first conduction terminal 11 includes the embedded heater 21 to perform temperature control through ON/OFF control. In Embodiment 1, the heater 21 is a cartridge heater, but may be of any other type.

Second Conduction Terminal

The second conduction terminal 12 of the electronic-component testing device A according to Embodiment 1 includes the temperature sensor 13. Accordingly, the second conduction terminal 12 achieves both of a function of a terminal for applying voltage and a function to measure the temperature of the electronic component.

A temperature detected by the temperature sensor 13 is fed back to the heater 21 provided to the first conduction terminal 11.

The second conduction terminal 12 is typically made of a metallic material and configured to contact the first external electrode 1 of the electronic component 10 when the electronic component (multilayer ceramic capacitor in Embodiment 1) 10 is disposed at the predetermined position.

The metallic material of the second conduction terminal 12 is, for example, a metal such as Cu, Fe, or Al.

In Embodiment 1, the second conduction terminal 12 has a bar-shaped structure, but is not limited to a bar shape. The second conduction terminal 12 may have a plate spring shape or the shape of any other typical measure terminal.

To achieve favorable electric contact, the second conduction terminal 12 desirably has the structure of a spring probe or a plate spring, which provides a spring characteristic of pressing toward the external electrode of the electronic component 10. The pressing of the electronic component 10 by the second conduction terminal 12 increases a contact area between the electronic component 10 and the first conduction terminal 11, thereby achieving further heating or heat-releasing of the electronic component 10. A pressing load is, for example, 30 gf to 1000 gf.

In addition, to achieve favorable electric contact, for example, plating of Au, Ag, Ni, or Sn may be provided to a surface of the second conduction terminal 12, which contacts the external electrode (first external electrode 1) of the electronic component 10.

The second conduction terminal 12 preferably has a large thermal resistance against external air to prevent heat generated by the electronic component 10 from externally escaping through the second conduction terminal 12. The second conduction terminal 12 desirably has a reduced surface area by, for example, reducing the width thereof. The second conduction terminal 12 may be covered by a heat insulating material.

The second conduction terminal 12 desirably has a thermal resistance higher than that of the first conduction terminal 11. For example, when the first conduction terminal 11 has a thermal resistance of 40° C./W, the second conduction terminal 12 desirably has a thermal resistance approximately 10 to 100 times larger than that of the first conduction terminal 11.

In Embodiment 1, the auxiliary heater 22 is disposed near the second conduction terminal 12 to more reliably prevent the heat generated by the electronic component 10 from externally escaping from the second conduction terminal 12.

Temperature Sensor

In Embodiment 1, the temperature sensor 13 is a thermocouple temperature sensor. The temperature sensor 13 is desirably disposed as near the electronic component 10 as possible to accurately detect the temperature of the electronic component 10.

To improve heat transfer from the electronic component to a sensing unit (leading end) of the temperature sensor 13, a path to the leading end is preferably made of a material having as a high thermal conductivity as possible.

Specifically, Cu, Ag, Al, or carbon, which is typically categorized as a high thermal conductivity material, is desirably used. These materials each have a thermal conductivity beyond 50 W/m·K.

Insulating Terminal

The insulating terminal 16 of the electronic-component testing device A according to Embodiment 1 is capable of pressing the second external electrode 2 to apply the predetermined pressing force toward the first conduction terminal 11. The pressing of the electronic component 10 by the insulating terminal 16 increases a contact area between the electronic component 10 and the first conduction terminal 11, thereby achieving further releasing of heat generated by the electronic component 10. The insulating terminal 16 is configured to have a pressing load of, for example, 30 gf to 1000 gf, which is substantially equal to the pressing load by the second conduction terminal 12.

Thus, the sum of the pressing loads by the first conduction terminal 11 and the second conduction terminal 12 is, for example, 60 gf to 2000 gf.

Accordingly, the first and second external electrodes 1 and 2 of the electronic component 10 are pressed against the first conduction terminal 11 by a substantially equal force, thereby preventing unbalanced distribution of the temperature of the electronic component 10 to efficiently perform heat-releasing and heating of the electronic component 10.

The insulating terminal 16 includes an insulating contact part 16a configured to contact the second external electrode 2. The insulating contact part 16a may be made of, for example, a material providing thermal resistance and insulation, such as PEEK or PPS (polyphenylene sulfide). To prevent heat from externally escaping through the insulating terminal 16, any material having a thermal conductivity of 100 W/m·K or higher is preferably not used.

Auxiliary Heater

As described above, in Embodiment 1, the auxiliary heater 22 is used to prevent heat generated by the electronic component 10 from externally escaping through the second conduction terminal 12. The use of the auxiliary heater facilitates more reliable maintaining of the electronic component 10 at a desired temperature when the thermal resistance of the second conduction terminal 12 against external air is not so large.

In Embodiment 1, the auxiliary heater 22 is embedded in an auxiliary heater body unit 22a disposed near the second conduction terminal 12.

The auxiliary heater 22 is an embedded cartridge heater, but not limited thereto, and may be of any other type.

Drive Source of First Conduction Terminal, Second Conduction Terminal, and Insulating Terminal In the electronic-component testing device A according to Embodiment 1, the first conduction terminal 11, the second conduction terminal 12, and the insulating terminal 16 provides a function to hold the electronic component 10 therebetween. The first conduction terminal 11 and the second conduction terminal 12 are provided with a drive source (not illustrated) configured to allow the first conduction terminal 11 and the second conduction terminal 12 to function as conduction terminals when in contact with the first and second external electrodes 1 and 2, and achieve releasing of the electronic component after a test.

The drive source (not illustrated) for operating the first conduction terminal 11, the second conduction terminal 12, and the insulating terminal 16 as described above may be a typical drive mechanism such as a servomotor, a pulse motor, a solenoid, an air cylinder, or a cam.

Voltage Application and Measurement System

The electronic-component testing device A according to Embodiment 1 includes a mechanism for applying a constant voltage between the first conduction terminal 11 and the second conduction terminal 12. Specifically, the voltage source 14 is connected with the first conduction terminal 11 to apply voltage to the second external electrode 2 of the electronic component 10, and current is detected by the current detection unit 15 coupled with the second conduction terminal 12 connected with the first external electrode 1 of the electronic component 10. The current detection unit 15 is virtually or actually grounded.

In Embodiment 1, current is detected by the current detection unit 15 coupled with the second conduction terminal 12. However, the voltage source (power source) 14 may be connected with the second conduction terminal 12 to apply voltage to the first external electrode 1 of the electronic component 10, and current may be detected by a current detection unit coupled with the first conduction terminal 11 connected with the second external electrode 2 of the electronic component 10.

The current detection unit may be omitted depending on the type of a test. The voltage source does not need to include a current limiting circuit (for example, a series resistance), but a series resistance or a fuse element is typically provided to prevent failure of the voltage source.

Control Unit (Temperature Feedback Control System)

The control unit 20 is a temperature adjuster configured to perform control such as a typically used PID control.

However, any other optional control method may be employed to control the switch based on calculation by an external controller.

In the electronic-component testing device A according to Embodiment 1, heat is unlikely to externally escape through the second conduction terminal 12 including the temperature sensor 13, which allows substantial matching between a temperature detected by the temperature sensor 13 and the actual temperature of the electronic component 10. In addition, since the electronic component 10 can be efficiency heated and cooled by the first conduction terminal 11, faster temperature feedback response can be achieved, thereby accurately controlling the temperature of the electronic component 10. Accordingly, during a test performed by heating the self-heating electronic component 10 to the predetermined test temperature, thermal runaway of the electronic component 10 can be prevented to accurately perform the test at the predetermined test temperature.

In Embodiment 1, the two external electrodes (the first and second external electrodes 1 and 2) of the electronic component 10 contact the first conduction terminal 11, which provides two heat releasing paths. In addition, the first and second external electrodes 1 and 2 are pressed against the first conduction terminal 11 by a substantially equal pressing force (pressing load). Thus, heating or heat-releasing can be performed substantially uniformly and efficiently through the first and second external electrodes 1 and 2.

This achieves a faster temperature feedback response, thereby accurately controlling the temperature of the electronic component 10.

The incorporation of the temperature sensor 13 in the second conduction terminal 12 provides space saving to achieve reduction in device size and reduction in facility cost with a simple configuration.

In a case of testing a large number of electronic components 10 in a short cycle, only the first conduction terminal 11, the second conduction terminal 12, or the insulating terminal 16 needs to be operated to allow the first conduction terminal 11, the second conduction terminal 12, and the insulating terminal 16 to reliably contact with the electronic component 10 to place the temperature sensor 13 near an external electrode of the electronic component 10. Accordingly, an improved operation efficiency can be achieved as compared to, for example, a case in which a temperature sensor such as a thermocouple is attached to an external electrode of the electronic component.

As described above, the electronic-component testing device A according to Embodiment 1 achieves an improved overall temperature feedback response. Thus, when an electronic component having a negative resistance temperature characteristic and likely to suffer thermal runaway due to self-heating is tested, the thermal runaway can be prevented during the test to perform accurately the test, which is advantageous in particular.

Embodiment 2

Figure 2:
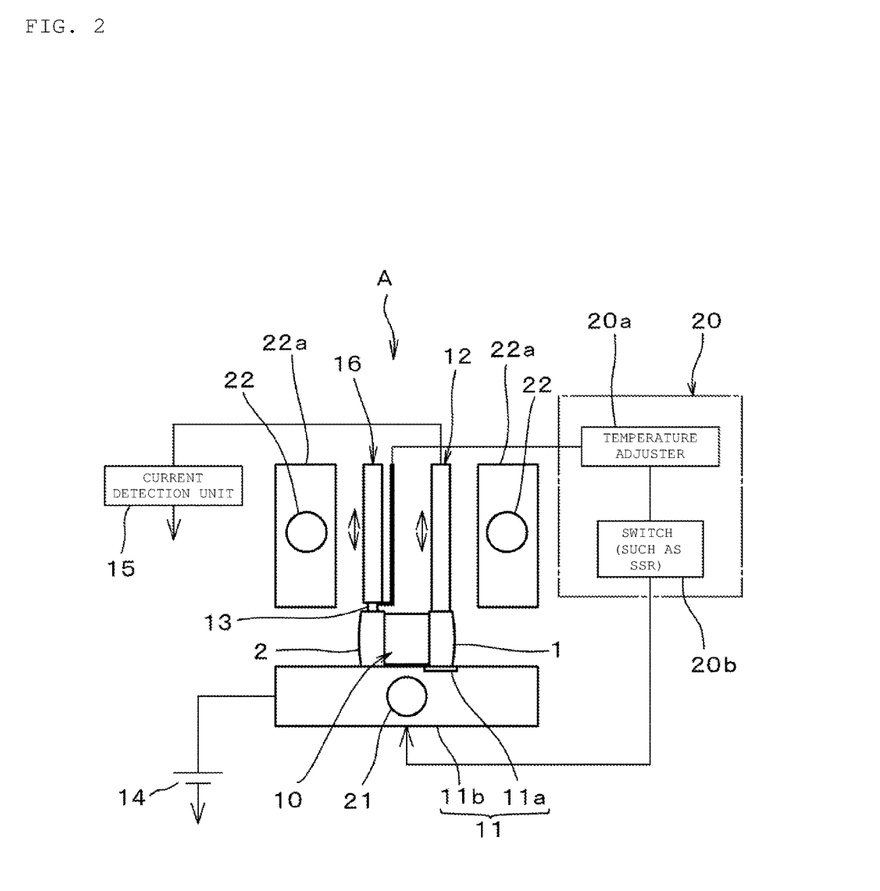
FIG. 2 is a diagram illustrating a main-part configuration of the electronic-component testing device according to another embodiment of the present disclosure (Embodiment 2).

FIG. 2 is a diagram illustrating a main-part configuration of the electronic-component testing device A according to another embodiment of the present disclosure (Embodiment 2). In FIG. 2, which illustrates the testing device A according to Embodiment 2 of the present disclosure, any part denoted by a reference sign identical to that in FIG. 1 indicates a part identical or equivalent to that in FIG. 1.

As illustrated in FIG. 2, the electronic-component testing device A according to Embodiment 2 includes the temperature sensor 13 for measuring the temperature of the electronic component 10, near a region of the insulating terminal 16, which contacts the second external electrode 2 of the electronic component 10. The insulating terminal 16 is made of an insulating material. In addition, the insulating terminal 16 is more preferably heat insulating.

In the electronic-component testing device A according to Embodiment 2, heat is unlikely to externally escape through the insulating terminal 16 including the temperature sensor 13, which allows substantial matching between a temperature detected by the temperature sensor 13 and the actual temperature of the electronic component 10.

When the insulating terminal 16 is made of a heat insulating material, a smaller amount of heat is externally transferred through the insulating terminal 16, thereby achieving increased measurement accuracy and enhanced response of the temperature sensor 13.

Figure 3:
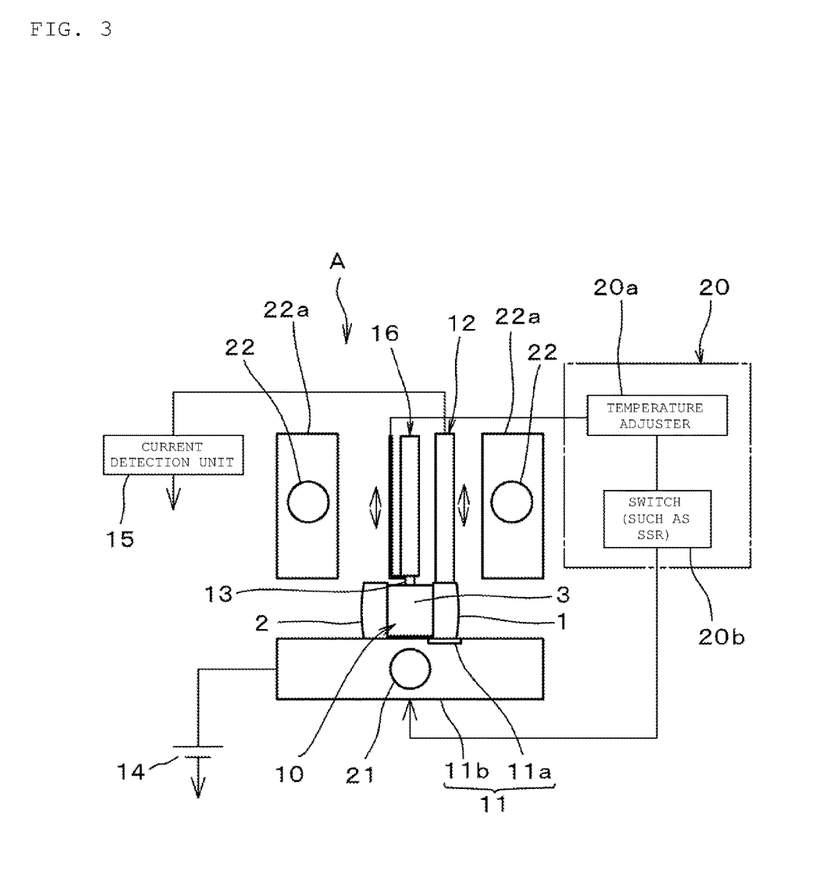
FIG. 3 is a conceptual diagram illustrating a modification of the electronic-component testing device according to Embodiment 2 of the present disclosure.

As illustrated in FIG. 3, the insulating terminal 16 including the temperature sensor 13 may be made in contact with a ceramic body 3 of the electronic component 10, which enables more accurate detection of the temperature of the ceramic body 3.

Embodiment 3

Figure 4:
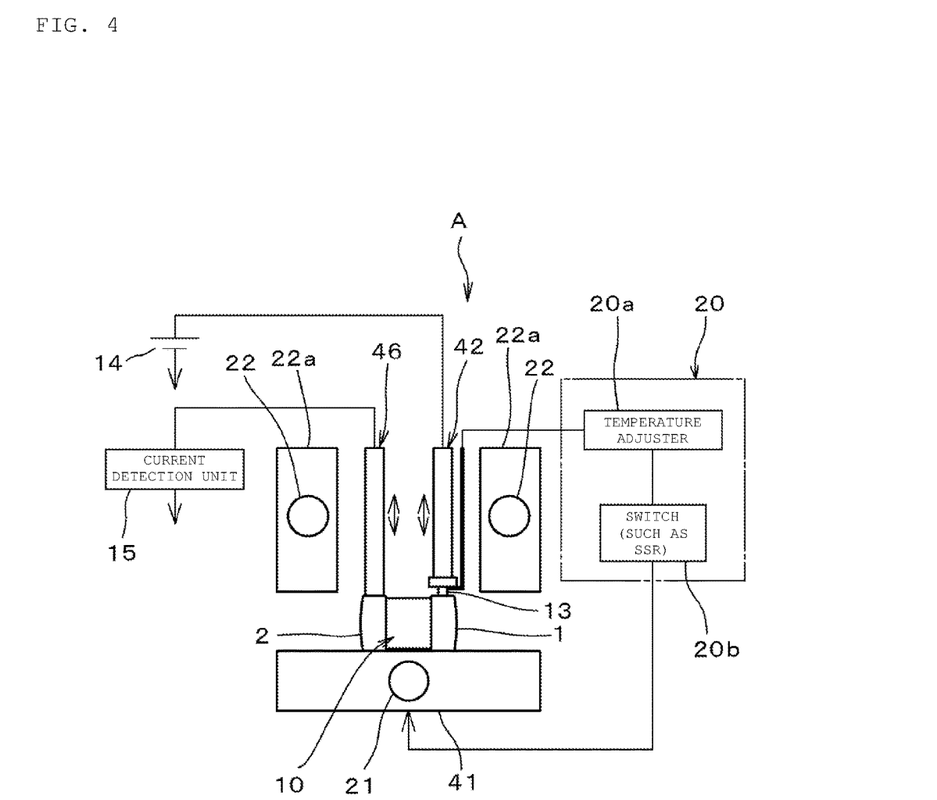
FIG. 4 is a diagram illustrating a main-part configuration of the electronic-component testing device according to another embodiment of the present disclosure (Embodiment 3).

FIG. 4 is a diagram illustrating a main-part configuration of the electronic-component testing device A according to another embodiment of the present disclosure (Embodiment 3). In FIG. 4, which illustrates the testing device A according to Embodiment 3 of the present disclosure, any part denoted by a reference sign identical to that in FIG. 1 indicates a part identical or equivalent to that in FIG. 1.

The testing device A includes a heat-transfer insulating terminal 41 on a principal surface of which the electronic component 10 is held. In Embodiment 3, the heat-transfer insulating terminal 41 is entirely made of an insulating material.

However, the heat-transfer insulating terminal 41 only needs to have a region made of an insulating material where the heat-transfer insulating terminal 41 contacts the first external electrode 1 and the second external electrode 2 of the electronic component 10, but does not necessarily need to be entirely made of an insulating material.

Thus, for example, only the surface of the region that contacts the first and second external electrodes 1 and 2 may be made of an insulating material, or the entire surface on which the electronic component 10 is held may be made of an insulating material.

The heat-transfer insulating terminal 41 includes the heater (electronic component heater) 21 configured to heat the electronic component 10 to a test temperature, and is capable of releasing a larger amount of heat than the amount of heat generated by self-heating of the electronic component 10.

The testing device A includes a metallic first-side conduction terminal 42 configured to contact the first external electrode 1 of the electronic component 10 and press the first external electrode 1 to apply the predetermined pressing force toward the heat-transfer insulating terminal 41.

Then, the temperature sensor 13 for measuring the temperature of the electronic component 10 is provided near a region of the first-side conduction terminal 42, which contacts the first external electrode 1 of the electronic component 10. The first-side conduction terminal 42 is connected with the voltage source 14.

The testing device A includes a metallic second-side conduction terminal 46 configured to contact the second external electrode 2 of the electronic component 10 and press the second external electrode 2 to apply the predetermined pressing force toward the heat-transfer insulating terminal 41. The second-side conduction terminal 46 is connected with the current detection unit 15.

The auxiliary heaters 22 are disposed near the first-side conduction terminal 42 and the second-side conduction terminal 46 to prevent heat from escaping from the electronic component 10 through the first-side conduction terminal 42 and the second-side conduction terminal 46.

The testing device A includes the control unit 20 configured to control the heater 21 to maintain the temperature of the electronic component 10 at the predetermined temperature by feeding back the temperature of the electronic component 10 detected by the temperature sensor 13 to the heaters. In Embodiment 3, the control unit 20 includes the temperature adjuster 20a and the switch (for example, SSR) 20b.

The electronic-component testing device according to Embodiment 3 may have, as necessary, a modification similarly to that for the electronic-component testing device according to Embodiment 1 described above.

A test of the electronic component 10 by using the testing device A is performed in, for example, a procedure described below.

(1) The electronic component 10 is placed at a predetermined position on the heat-transfer insulating terminal 41 with the first-side conduction terminal 42 being in contact with the first external electrode 1, and the second-side conduction terminal 46 being in contact with the second external electrode 2.

(2) The heater 21 is energized to heat the electronic component 10 to a test temperature (target temperature) (for example, 100° C.)

(3) Then, a predetermined voltage is applied to the electronic component 10. For example, the electric field intensity is 20 kV/mm or larger, and the voltage is 3 V to 1000 V approximately.

(4) While the voltage is applied, the temperature of the electronic component 10 is detected and fed back to the heater 21 of the heat-transfer insulating terminal 41 to perform control.

With the configuration illustrated in FIG. 4, the temperature of the electronic component 10 is maintained at a predetermined test temperature by controlling opening and closing of the switch 20b connected with the heater 21 of the heat-transfer insulating terminal 41.

(5) After the predetermined time has elapsed, the voltage application is ended, and the electronic component 10, on which the test is ended, is ejected.

As described above, the electronic-component testing device A according to Embodiment 3 is capable of efficiently heating and cooling the electronic component 10, thereby achieving a faster temperature feedback response to accurately control the temperature of the electronic component 10.

As a result, during a test performed by heating the self-heating electronic component 10 to a predetermined test temperature, thermal runaway of the electronic component 10 due to self-heating can be prevented to accurately perform the test at the predetermined test temperature.

In the electronic-component testing device A according to Embodiment 3, the first and second external electrodes 1 and 2 of the electronic component 10 contact regions of the heat-transfer insulating terminal 41 made of an identical material, thereby achieving release of substantially the same amount of heat from each external electrode. Accordingly, heat-releasing and heating can be efficiently performed while preventing ununiform distribution of the temperature of the electronic component 10.

When the testing device A according to Embodiment 3 is used, effects equivalent to those obtained when the above-described testing device A according to Embodiment 1 is used can be obtained in other points.

Embodiment 4

Figure 5:
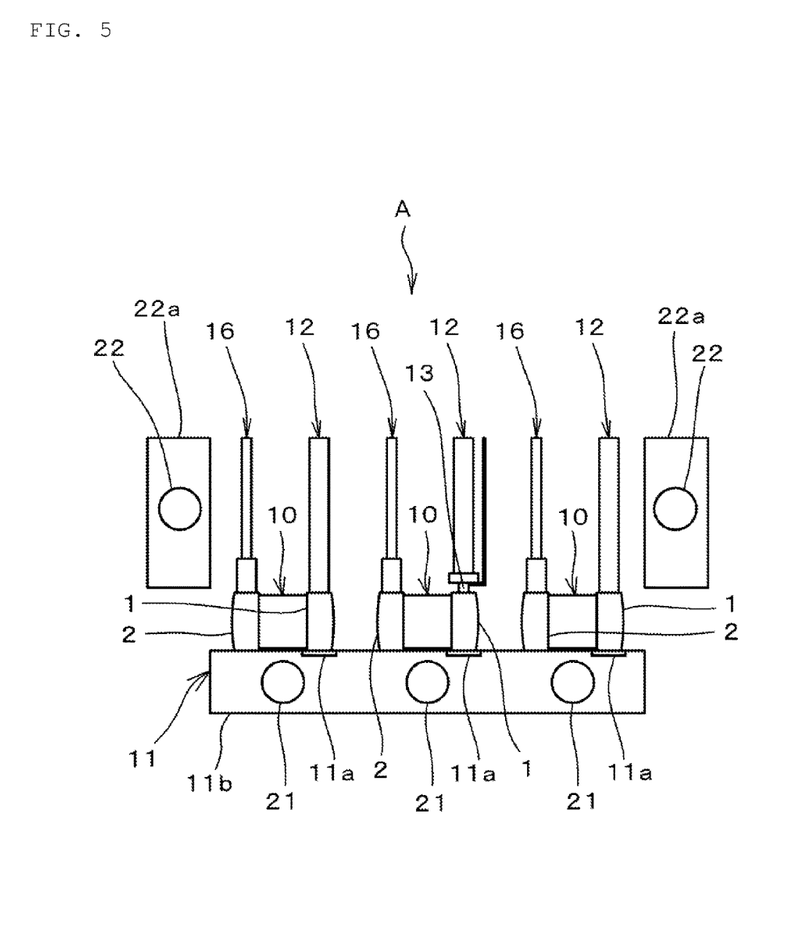
FIG. 5 is a schematic conceptual diagram illustrating the configuration of the electronic-component testing device according to another embodiment of the present disclosure (Embodiment 4).

FIG. 5 is a diagram illustrating a main-part configuration of the electronic-component testing device A according to another embodiment of the present disclosure (Embodiment 4).

In the electronic-component testing device A according to Embodiment 4, the second conduction terminal 12 contacts the first external electrode 1 of each of a plurality of electronic components (multilayer ceramic capacitors) 10 arranged side by side as illustrated in FIG. 5. The temperature sensor 13 is provided to one of the second conduction terminals 12 individually contacting the respective electronic components 10. The single first conduction terminal 11 contacts the second external electrodes 2 of the electronic components 10.

The auxiliary heaters 22 are disposed near the second conduction terminals 12 at the right and left ends in FIG. 5 to prevent heat-releasing from the electronic component 10.

In Embodiment 4, the temperature sensor 13 is provided to only one of the second conduction terminals 12 as illustrated in FIG. 5. However, the temperature sensors 13 may be provided to some or all of the second conduction terminals 12.

When the temperature sensors 13 are installed at some of the second conduction terminals 12, temperature control needs to be performed by calculating an average value or representative value of temperatures obtained by the temperature sensors 13 and controlling turning on and off of the heater 21 based on a result of the calculation. Except for this, the same configuration as that of Embodiment 1 described above may be employed.

Calculation of the representative value includes a case in which values measured by the sensors are sequentially arranged to select a sensor providing a value near the center thereof, and a case in which any abnormal value sensor to be described later is omitted based on a predetermined priority of each sensor.

In FIG. 5, which illustrates the testing device A according to Embodiment 4 of the present disclosure, any part denoted by a reference sign identical to that in FIG. 1 indicates a part identical or equivalent that in FIG. 1.

The size of the first conduction terminal 11 needs to be increased to reduce the thermal resistance of the first conduction terminal 11. A large heat-releasing effect can be achieved when the single large first conduction terminal 11 contacts the electronic components 10. In other words, the volume of the first conduction terminal 11 available per unit volume can be increased by using an integrated first conduction terminal 11 in place of individual separated first conduction terminals 11, thereby achieving a large heat-releasing effect.

This enables effective reduction in the thermal resistance of the first conduction terminal 11 and reduction in device size.

The reduction in the thermal resistance of the first conduction terminal 11 reduces temperature increase due to self-heating of the electronic component 10, and achieves an improved temperature feedback response. In addition, a simplified device configuration is allowed, which enables reduction in facility cost.

Embodiment 5

Figure 6:
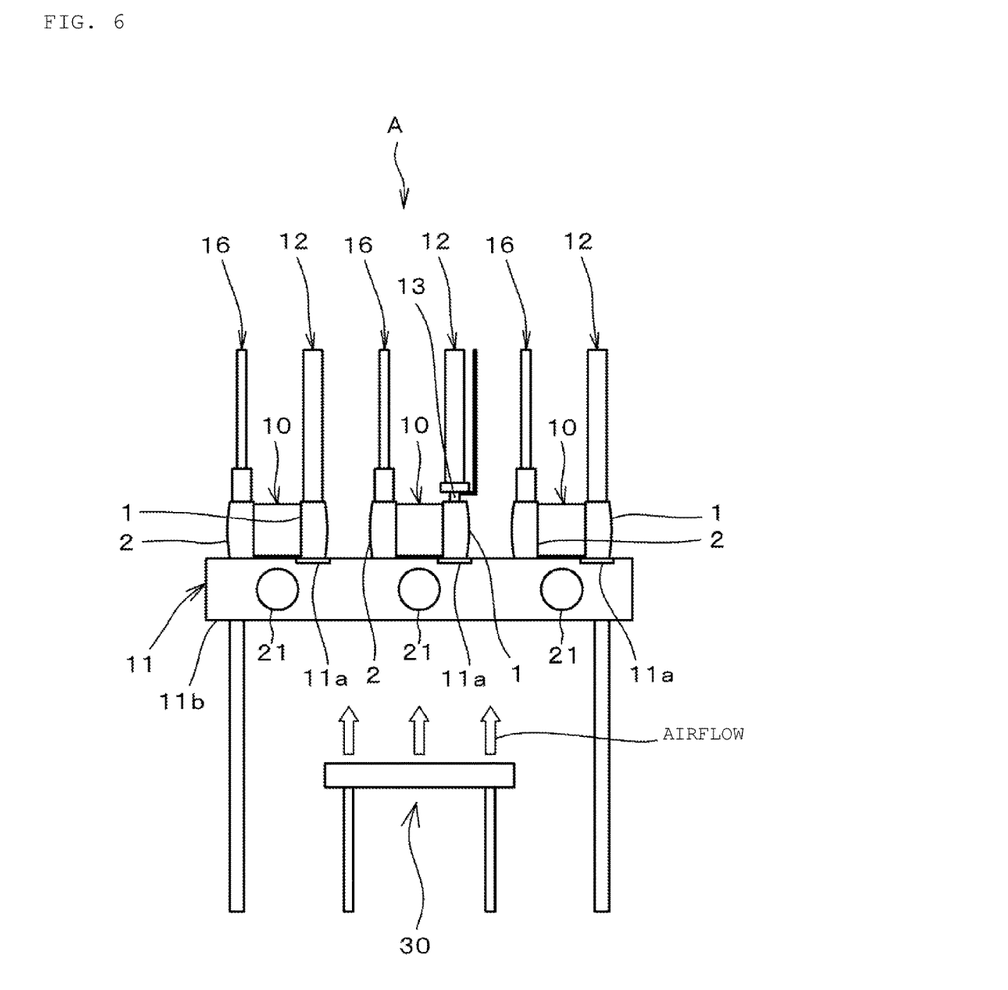
FIG. 6 is a schematic conceptual diagram illustrating the configuration of the electronic-component testing device according to another embodiment of the present disclosure (Embodiment 5).

FIG. 6 is a diagram illustrating a main-part configuration of the electronic-component testing device A according to another embodiment of the present disclosure (Embodiment 5).

In the electronic-component testing device A according to Embodiment 5, as illustrated in FIG. 6, the second conduction terminal 12 contacts the first external electrode 1 of each of a plurality of electronic components (multilayer ceramic capacitors) 10 arranged side by side.

The temperature sensor 13 is provided to one of the second conduction terminals 12 contacting the respective electronic components 10. The single first conduction terminal 11 contacts the second external electrodes 2 of the electronic components 10.

The electronic-component testing device A according to Embodiment 5 does not include the auxiliary heaters provided in the electronic-component testing device A according to Embodiments 1 and 4.

As illustrated in FIG. 6, the temperature sensor 13 may be provided to only one of the second conduction terminals 12. However, the temperature sensors 13 may be provided to some or all of the second conduction terminals 12.

When the temperature sensors 13 are installed at some of the second conduction terminals 12, temperature control needs to be performed by calculating an average value or representative value of temperatures obtained by the temperature sensors 13 and controlling turning on and off of the heater based on a result of the calculation.

In the electronic-component testing device A according to Embodiment 5, a fan 30 is provided as a blast unit below the first conduction terminal 11 to improve the cooling capacity of the first conduction terminal 11 by blowing air to the first conduction terminal 11. The fan (blast unit) 30 may be turned on and off in a switching manner as necessary, or may be kept turned on to continuously blow air to the first conduction terminal 11.

As in the electronic-component testing device A according to Embodiment 5, when the cooling capacity is improved by blowing air to the first conduction terminal 11 through the fan 30, the thermal resistance of the first conduction terminal 11 can be reduced to prevent increase in the temperature of the electronic component 10 due to self-heating.

In addition, the reduction in the thermal resistance of the first conduction terminal 11 allows fast cooling of the electronic component 10 upon self-heating of the electronic component 10, thereby achieving an improved feedback response and reducing occurrence of thermal runaway.

In Embodiment 5, the cooling capacity of the first conduction terminal 11 is improved by directly blowing air to the first conduction terminal 11 through the fan 30 as a blast unit. However, instead of directly blowing air to the first conduction terminal 11, the fan may be used to circulate air near the first conduction terminal 11 and reduce the thermal resistance by airflow (flow of air).

In Embodiment 5, the fan is used as a blast unit. However, the blast unit is not limited to a fan, and any blast unit configured to discharge gas through a nozzle is applicable.

As described above, the electronic-component testing device A according to Embodiment 5 includes no auxiliary heater. When the first conduction terminal 11 has a sufficient heating and cooling functionality, however, it is possible to maintain the temperature of the electronic component 10 at a predetermined test temperature irrespective of any small temperature difference between a sensor and a work, while preventing increase in the temperature of the electronic component 10 due to self-heating.

The electronic-component testing device A according to Embodiment 5 may include an auxiliary heater.

Embodiment 6

Figure 7:
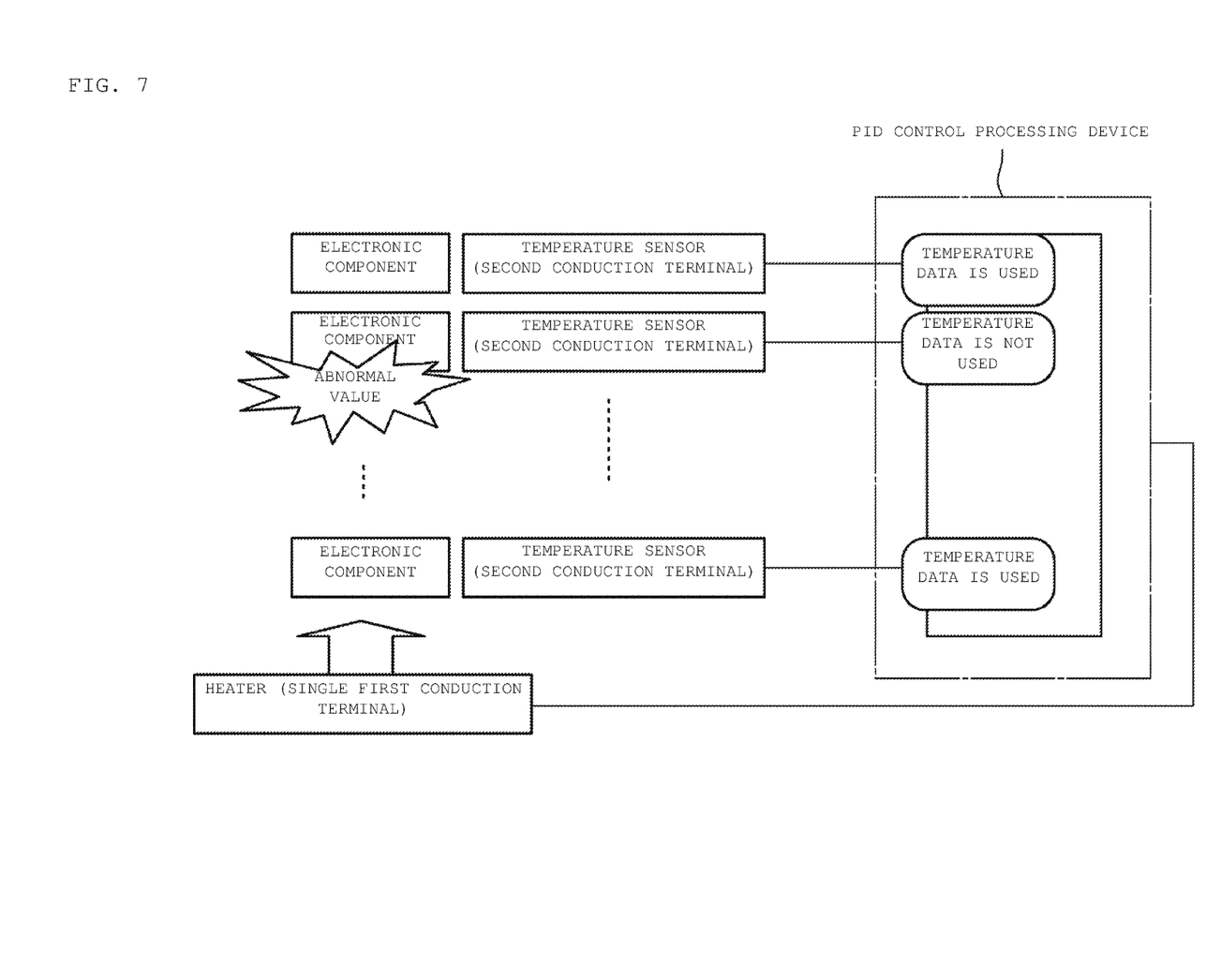
FIG. 7 is a schematic conceptual diagram illustrating the configuration of the electronic-component testing device according to another embodiment of the present disclosure (Embodiment 6).

FIG. 7 is a schematic conceptual diagram illustrating the configuration of the electronic-component testing device A according to another embodiment of the present disclosure (Embodiment 6).

In the electronic-component testing device A according to Embodiment 6, a temperature sensor is provided to each of a plurality of electronic components (for example, multilayer ceramic capacitors) as illustrated in FIG. 7. The electronic-component testing device A is capable of heating the electronic components to a predetermined test temperature through heating by a single heater (specifically, a single first conduction terminal including the heater). The temperature of each electronic component can be detected by the temperature sensor.

Then, an average value or an extracted representative value is calculated from the detected temperatures. The average value or the extracted representative value is fed back to the heater to control the heater so that the temperature of each electronic component is maintained at a predetermined temperature. When any of the temperature sensors has detected an abnormal temperature, an electronic component for which the abnormal temperature is detected is excluded as a sensor employed for the calculation.

In other words, in Embodiment 6, a single heat source (in other words, the single first conduction terminal) controls the temperatures of the plurality of electronic components, and a control signal based on a result of measurement of the temperature of each electronic component by the temperature sensor is transmitted (fed back) to the heater (heater provided to the single first conduction terminal) through a temperature adjuster configured to perform optional temperature control calculation such as PID control.

In the control by feeding back the control signal, the feedback is performed for electronic components except for, for example, (a) any short-circuited electronic component, (b) any abnormally heating electronic component, and (c) any electronic component for which a temperature clearly presumed to be abnormal is detected due to, for example, contact failure between the temperature sensor and the electronic component. The temperatures of the remaining electronic components detected by the temperature sensors are used in the calculation of an average or extracted representative value.

With the configuration according to Embodiment 6, when an abnormal temperature due to, for example, self-heating is detected for any electronic component, handling the temperature as an abnormal value allows substantial elimination of influence to the remaining majority of electronic components, thereby achieving correct temperature control.

For example, when an electric property such as current or resistance is measured, the above-described abnormity detection may be performed based on abnormity of the electric property in place of abnormity in temperature.

Embodiment 6 describes the case in which the temperature sensor is provided to each of the plurality of electronic components (for example, multilayer ceramic capacitors), and the plurality of electronic components can be heated to a predetermined test temperature by the single heater (specifically, the single first conduction terminal including heater). The electronic components may be divided into a plurality of predetermined groups so that the temperatures of a plurality of electronic components in each group are detected by a single temperature sensor as in, for example, Embodiments 4 and 5.

The above-described embodiments each describe the case in which the electronic component is the multilayer ceramic capacitor. However, the present disclosure is not limited to the multilayer ceramic capacitor, and is applicable to tests of other electronic components including semiconductor elements such as a negative temperature coefficient thermistor, a diode, and a transistor, and capacitors other than a ceramic capacitor.

The above-described embodiments each describe the case in which the temperature sensor is the thermocouple. However, the temperature sensor may be, for example, a temperature measurement resistor exploiting substantial proportionality of the electric resistance of metal with temperature.

The present disclosure is not limited to the above-described embodiments in any other aspect. Various kinds of applications and modifications within the scope of the disclosure are possible for, for example, the configurations of a first conduction terminal, a second conduction terminal, an insulating terminal, and a control unit configured to control a heater.

The invention claimed is:

1. An electronic-component testing device configured to perform a test by applying voltage while keeping, at a predetermined test temperature higher than ordinary temperature, a self-heating electronic component including a first external electrode and a second external electrode, the electronic-component testing device comprising:
   a first conduction terminal having a principal surface on which the electronic component is held,
   the first conduction terminal including an insulation region at least a surface of which is an insulating material and a region other than the insulation region, and the first external electrode of the electronic component contacting the insulation region to prevent electrical conduction and the second external electrode contacting the region other than the insulation region to allow electrical conduction,
   the first conduction terminal including a heater configured to heat the electronic component to the test temperature, and being capable of releasing a larger amount of heat than the amount of heat generated by self-heating of the electronic component;
   a second conduction terminal configured to be pressed against the first external electrode of the electronic component held on the first conduction terminal, which contacts the insulation region of the first conduction terminal, in order to apply a predetermined pressing force toward the first conduction terminal;
   an insulating terminal configured to be pressed against the second external electrode of the electronic component held on the first conduction terminal, which contacts the region other than the insulation region of the first conduction terminal to achieve electrical conduction, in order to apply a predetermined pressing force toward the first conduction terminal, or the insulating terminal configured to be pressed against a region of the electronic component, in which the first external electrode and the second external electrode are not located, in order to apply a predetermined pressing force toward the first conduction terminal;
   a temperature sensor provided to one of the second conduction terminal and the insulating terminal to measure the temperature of the electronic component; and
   a control unit configured to control the heater to maintain the temperature of the electronic component at the test temperature by feeding back the temperature of the electronic component detected by the temperature sensor to the heater.

2. The electronic-component testing device according to claim 1, wherein an auxiliary heater is arranged near the second conduction terminal and the insulating terminal to prevent heat from escaping from the electronic component through the second conduction terminal and the insulating terminal.

3. The electronic-component testing device according to claim 1, wherein
   the second conduction terminal individually contacts each of the first external electrodes of a plurality of the electronic components arranged side by side,
   the insulating terminal individually contacts each of the second external electrodes of the plurality of the electronic components, or each of the regions of the electronic components in which the first external electrode and the second external electrode are not located,
   the temperature sensor is provided to at least one of the second conduction terminal and the insulating terminal contacting each of the plurality of the electronic components, and
   the single first conduction terminal contacts each of the second external electrodes of the plurality of the electronic components.

4. The electronic-component testing device according to claim 3, wherein
   the plurality of the electronic components are heated to the test temperature while the second conduction terminal contacts the first external electrode of each of the plurality of the electronic components and the single first conduction terminal contacts each second external electrode,
   the temperatures of the plurality of the electronic components or temperatures of predetermined electronic-component groups into which the plurality of the electronic components are divided are detected by a plurality of the temperature sensors, and
   an average value or an extracted representative value is calculated from the temperatures detected by the plurality of the temperature sensors, the average value or the extracted representative value is fed back to the heater to control the heater so that the temperature of the electronic component or each electronic-component group is maintained at the test temperature, and when any of the temperature sensors has detected an abnormal temperature, the electronic component or the electronic-component group for which the abnormal temperature is detected is excluded as an electronic component or an electronic-component group employed for the calculation.

5. The electronic-component testing device according to claim 1, further comprising a cooling unit configured to cool the first conduction terminal by airflow.

6. An electronic-component testing device configured to perform a test by applying voltage while keeping, at a predetermined test temperature higher than ordinary temperature, a self-heating electronic component including a first external electrode and a second external electrode, the electronic-component testing device comprising:
   a heat-transfer insulating terminal having a principal surface on which the electronic component is held,
   the heat-transfer insulating terminal including regions that contact the first external electrode and the second external electrode of the electronic component, at least surfaces of the regions being an insulating material,
   the heat-transfer insulating terminal including a heater configured to heat the electronic component to the test temperature, and being capable of releasing a larger amount of heat than the amount of heat generated by self-heating of the electronic component;
   a first-side conduction terminal configured to be pressed against the first external electrode of the electronic component held on the heat-transfer insulating terminal to apply a predetermined pressing force toward the heat-transfer insulating terminal;
   a second-side conduction terminal configured to be pressed against the second external electrode of the electronic component held on the heat-transfer insulating terminal to apply a predetermined pressing force toward the heat-transfer insulating terminal;

a temperature sensor provided to one of the first-side conduction terminal and the second-side conduction terminal to measure the temperature of the electronic component; and a control unit configured to control the heater to maintain the temperature of the electronic component at the test temperature by feeding back the temperature of the electronic component detected by the temperature sensor to the heater.

* * * * *